United States Patent [19]

Damm et al.

[11] 4,163,950
[45] Aug. 7, 1979

[54] ISOLATING DIFFERENTIAL AMPLIFIER

[75] Inventors: Wendell W. Damm; Choong R. Kim, both of Aloha, Oreg.

[73] Assignee: Tektronix, Inc., Beaverton, Oreg.

[21] Appl. No.: 882,532

[22] Filed: Mar. 1, 1978

[51] Int. Cl.² .......................... H03F 17/00; H03F 3/45
[52] U.S. Cl. ...................................... 330/252; 330/59; 330/308
[58] Field of Search .................... 330/59, 69, 252, 308; 250/214 A; 307/311

[56] References Cited

U.S. PATENT DOCUMENTS

| | | | |
|---|---|---|---|
| 3,473,036 | 10/1969 | Marcus | 307/311 X |
| 3,689,752 | 9/1972 | Gilbert | 330/252 X |
| 3,810,034 | 5/1974 | Brunsch | 330/59 |
| 3,955,149 | 5/1976 | Trilling | 330/59 X |

FOREIGN PATENT DOCUMENTS

| | | | |
|---|---|---|---|
| 464953 | 9/1975 | U.S.S.R. | 330/59 |
| 507938 | 4/1976 | U.S.S.R. | 307/311 |

Primary Examiner—James B. Mullins
Attorney, Agent, or Firm—George T. Noe

[57] ABSTRACT

A differential amplifier includes an input stage and an output stage which are electrically isolated from each other to permit the input and output portions of the circuit to be operated at different voltage levels. A pair of optical couplers are employed to couple the differential signal from the input stage to the output stage. The output stage comprises a linear gain cell to provide an output signal proportional to the differential signal through the couplers divided by the common-mode signal through the couplers to stabilize gain and minimize D.C. offset drift caused by small changes in physical parameters or temperature.

4 Claims, 1 Drawing Figure

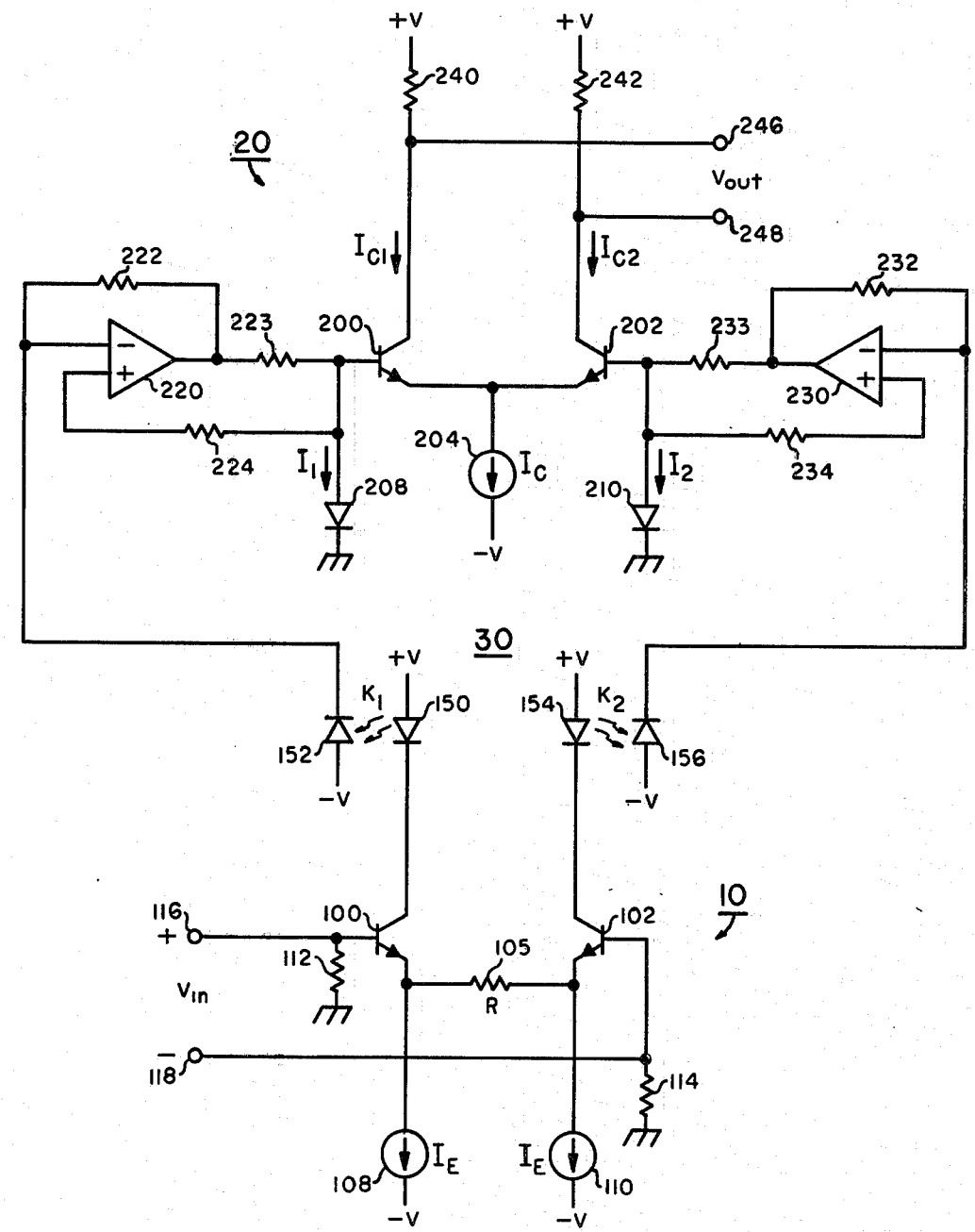

ISOLATING DIFFERENTIAL AMPLIFIER

BACKGROUND OF THE INVENTION

The present invention generally relates to differential amplifier circuits, and more particularly to isolating multistage differential amplifiers for electrically isolating input and output stages.

Isolating amplifiers are utilized in signal-processing situations in which one portion of a circuit is operated at different voltage levels with respect to another portion of a circuit. For example, an electrical test and measurement instrument may be operated with reference to earth potential while a circuit under test may be floating, or may be elevated to a high voltage potential with respect to ground.

Prior art isolation circuits have relied primarily on transformers to perform the dual role of providing electrical isolation and signal coupling. However, transformers have severe limitations in that they are bulky and are responsive only to changing signals. In the past few years, optical couplers have become popular because of their ability to pass distortion-free signals within their operating limits while simultaneously providing electrical isolation between input and output.

While optical couplers have provided improved low frequency signal coupling, a problem which continues to perplex designers of isolating amplifier circuits is that of gain and offset drift caused by changes either in operating temperature or in the physical parameters of amplifying devices with age. Attempts to solve this problem have included complex compensating networks or feedback circuits.

SUMMARY OF THE INVENTION

In accordance with the present invention, an isolating multi-stage differential amplifier includes an input stage and an output stage which are electrically isolated from each other by optical couplers to permit the input and output portions of the circuit to be operated at different voltage levels while accurately processing an electrical signal. The input stage is a differential amplifier which converts an input signal to a differential driving current for operating the optical couplers. The optical couplers comprise a pair of light sources coupled respectively to a pair of photo sensors, which suitably may be photo diodes or photo transistors. The differential input configuration permits both optical couplers to be operated from about midpoint of their dynamic range with respect to the balanced condition of the input differential amplifier; that is, as the differential signal current shifts from one side of the differential amplifier to the other, the illuminance of one light source increases as the other decreases. The output stage comprises a Gilbert gain cell, which is a particular type of current-driven linear differential amplifier, to provide an output signal proportional to the differential input signal divided by any common-mode component reaching the gain cell inputs, so that as a result gain changes and D.C. offset drift due to changes in conductivity of the amplifying devices is cancelled.

It is therefore one object of the present invention to provide a novel isolating differential amplifier.

It is another object to provide an isolating amplifier in which changes in gain are minimized.

It is a further object to provide an isolating amplifier in which D.C. offset is cancelled.

It is an additional object to provide a gain-stabilized and offset-stabilized isolating amplifier of simple construction and few operating parts.

Further objects, features, and advantages will be apparent from consideration of the following description taken in conjunction with the accompanying drawing.

DRAWING

The single FIGURE is a schematic diagram of the preferred embodiment according to the present invention.

DETAILED DESCRIPTION OF PREFERRED EMBODIMENT

A multistage differential amplifier consists generally of an input stage 10 and an output stage 20 which are electrically isolated from each other by a pair of optical couplers 30.

The input stage 10 comprises a pair of transistors 100 and 102, the emitters of which are coupled together through a resistor 105, and which emitters are further connected respectively to a pair of constant-current sinks 108 and 110. The constant-current sinks 108 and 110 are returned to a suitable negative supply voltage, $-V$. A pair of biasing resistors 112 and 114 are provided between ground and the respective bases of transistors 100 and 102 to establish the quiescent operating point of the differential amplifier. In the absence of an input signal, the conduction of transistors 100 and 102 is balanced so that the collector current of transistor is essentially equal to $I_E$, the value produced by each of the constant-current sinks 108 and 110. A first input terminal 116 is connected to the base of transistor 100, and a second input terminal 118 is connected to the base of transistor 102. A differential input signal is applied between the input terminals 116 and 118, and hence, between the bases of transistors 100 and 102 and developed across resistor 105. Thus the collector current of either transistor 100 or 102 may be defined as $I_E \pm V_{in}/R$, where R is the resistance value of resistor 105. The circuit described to this point is a conventional differential amplifier circuit, and is well known to those having ordinary skill in the art. It is also known to ground one transistor base while applying a single-ended input to the opposite base to achieve substantially the same differential output result; however, for this discussion a differential input voltage signal $V_{in}$ is assumed.

The pair of optical couplers 30 includes a pair of light sources driven by the outputs of the input stage 10, which light sources are optically coupled to a pair of photo sensors which produce a differential input current for the output stage 20. A light-emitting diode 150 is disposed in a normally forward-biased direction between the collector of transistor 100 and a suitable positive supply voltage $+V$ to provide a light source. The light output from light-emitting diode 150 is coupled to a photodiode 152, which produces a current proportional to the light in accordance with a transfer constant $k_1$. Similarly, a light-emitting diode 154 is disposed in a normally forward-biased direction between the collector of transistor 102 and the positive supply voltage $+V$, and the light output is coupled to a photodiode 156 to produce a proportional current in accordance with a transfer constant $k_2$. The photodiodes 152 and 156 suitably may be phototransistors, such as Motorola MOC 1005 high-isolation couplers, with the bases and collectors tied together. As shown, these photodiodes are reverse biased.

The operating points of light-emitting diodes 150 and 154 are chosen such that the light outputs therefrom are substantially matched at about midpoint of the respective dynamic ranges thereof when the differential input stage 10 is balanced, that is, when transistors 100 and 102 are conducting equally. The operating points of photodiodes 152 and 156 are similarly chosen such that the current outputs therefrom are substantially matched at about midpoint of the respective dynamic ranges thereof when the differential input stage 10 is balanced. The current outputs from photodiodes 152 and 156 under signal conditions are equal to $k_1(I_E+V_{in}/R)$ and $k_2(I_E-V_{in}/R)$ respectively so that a differential input current is available for the output stage 20. The optical coupler components may be physically arranged so the both light-emitting diodes and both photodiodes are subjected to the same environmental conditions, such as temperature, permitting a close match of operating characteristics. Of course, it is understood that proper precautions must be taken to ensure that all of the light from the light-emitting diodes is coupled to the respective photodiodes while other light is blocked out, and the two couplers are light-isolated from each other.

The output stage 20 comprises matched transistors 200 and 202 having their emitters connected together and to a constant-current sink 204, which current sink is returned to the negative supply voltage $-V$. A pair of matched diodes 208 and 210 are connected from the respective bases of transistors 200 and 202 to ground, and are disposed in a forward-biased direction with respect to the base-emitter junctions of the transistors. The linear differential amplifier described thus far is known in the electronics industry as a Gilbert gain cell, and is fully disclosed in U.S. Pat. No. 3,689,752. A current $I_C$ generated by constant-current sink 204 is the sum of collector currents $I_{C1}$ and $I_{C2}$ flowing through transistors 200 and 202 respectively. Assuming an input current $I_1$ flowing through diode 208 and an input current $I_2$ flowing through diode 210, the output differential current signal may be defined as $I_{C1}-I_{C2}=(I_1-I_2)/(I_1+I_2)$. From this equation it can be seen that the output signal is proportional to the differential signal divided by the common-mode signal.

A first operational amplifier comprising amplifier 220 and its associated resistors 222-224 is coupled between the cathode of photodiode 152 and the base of transistors 200. The current gain $A_1$ of this operational amplifier is determined by the ratio of resistance values of resistors 222 and 223, and may be defined as $A_1=-R_{222}/R_{223}$. Therefore, the input current $I_1$ may now be defined as $I_1=A_1k_1(I_E+V_{in}/R)$.

Similarly, a second operational amplifier comprising amplifier 230 and its associated resistors 232-234 is coupled between the cathode of photodiode 156 and the base of transistor 202. The current gain $A_2$ of this second operational amplifier is determined by the ratio of resistance values of resistors 232 and 233, and may be defined as $A_2=-R_{232}/R_{233}$. The input current $I_2$ may now be defined as $I_2=A_2k_2(I_E-V_{in}/R)$. The resistance values of resistors 232 and 233 may be chosen to compensate for differences in the current transfer constants $K_1$ and $k_2$ of the optical couplers so that $A_1k_1=A_2k_2$. Assuming this condition to be true, it can be shown by algebraic manipulation that the differential output current $I_{C1}-I_{C2}=\pm I_C V_{in}/RI_E$.

The currents $I_{C1}$ and $I_{C2}$ are developed across resistors 240 and 242 respectively to produce a differential output voltage signal which is made available at output terminals 246 and 248.

While we have shown and described the preferred embodiment of our invention, it will be apparent to those skilled in the art that many changes and modifications may be made without departing from our invention in its broader aspects.

What we claim as being novel is:

1. An isolating differential amplifier, comprising:
an input differential amplifier stage comprising a first pair of emitter coupled transistors, a resistor having a predetermined resistance value connected between the emitters of said transistors, and a pair of constant current sinks, each of which is connected to a respective emitter, said input differential amplifier stage for receiving an input signal at the bases of said first pair of transistors and producing a differential signal therefrom;
an output differential stage comprising a second pair of emittercoupled transistors and a constant current sink connected to both emitters of said second pair of transistors, said output differential amplifier stage being responsive to said differential signal for producing an output signal; and
optical coupling means for coupling said differential signal from the collectors of said first pair of emitter coupled transistors to the bases of said second pair of emitter coupled transistors.

2. An isolating amplifier in accordance with claim 1 wherein said optical coupling means comprises a pair of light sources connected to the collector circuit of said first differential amplifier and a pair of photosensors connected to the base circuit of said second differential amplifier, wherein the light produced by each of said pair of light sources is coupled to a respective one of said pair of light sensors.

3. An isolating amplifier in accordance with claim 2 wherein said light sources comprise light-emitting diodes and said photo sensors comprise photodiodes.

4. An isolating amplifier in accordance with claim 1 wherein said output differential amplifier stage further includes a pair of diodes, each of which is connected to a respective base of said second pair of transistors.

* * * * *

UNITED STATES PATENT AND TRADEMARK OFFICE
CERTIFICATE OF CORRECTION

PATENT NO. : 4,163,950
DATED : August 7, 1979
INVENTOR(S) : Wendell William Damm/Choong Ryong Kim It is certified that error appears in the above-identified patent and that said Letters Patent are hereby corrected as shown below:

Col. 3, Lines 42 and 43, the equation should read:

$$--I_{C1} - I_{C2} = I_C(I_1 - I_2)/(I_1 + I_2).--$$

Signed and Sealed this

Twentieth Day of November 1979

[SEAL]

Attest:

RUTH C. MASON
*Attesting Officer*

LUTRELLE F. PARKER
*Acting Commissioner of Patents and Trademarks*